(12) United States Patent
Kuemerle et al.

(10) Patent No.: US 7,475,366 B2
(45) Date of Patent: Jan. 6, 2009

(54) INTEGRATED CIRCUIT DESIGN CLOSURE METHOD FOR SELECTIVE VOLTAGE BINNING

(75) Inventors: Mark W. Kuemerle, Winooski, VT (US); Susan K. Lichtensteiger, Essex Junction, VT (US); Douglas W. Stout, Milton, VT (US); Ivan L. Wemple, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 11/462,508

(22) Filed: Aug. 4, 2006

(65) Prior Publication Data

US 2008/0034337 A1    Feb. 7, 2008

(51) Int. Cl.
  *G06F 17/50* (2006.01)
(52) U.S. Cl. .............................................. 716/1; 716/2
(58) Field of Classification Search ...................... 716/1, 716/2, 18
  See application file for complete search history.

(56) References Cited

U.S. PATENT DOCUMENTS

| | | | |
|---|---|---|---|
| 5,286,656 A | | 2/1994 | Keown et al. |
| 5,633,825 A | | 5/1997 | Sakuta et al. |
| 5,774,367 A | | 6/1998 | Reyes et al. |
| 6,090,152 A | * | 7/2000 | Hayes et al. ................... 716/6 |
| 6,295,630 B1 | * | 9/2001 | Tamegaya ...................... 716/4 |
| 6,370,676 B1 | | 4/2002 | Hayashi et al. |

(Continued)

FOREIGN PATENT DOCUMENTS

JP        07/045100        2/1995

OTHER PUBLICATIONS

Daniels, et al., "Self Optimization of Working Frequency for Computer Subsystems," IBM Technical Disclosure Bulletin, vol. 41, No. 01, Jan. 1998, pp. 377-379.

(Continued)

*Primary Examiner*—Jack Chiang
*Assistant Examiner*—Binh C Tat
(74) *Attorney, Agent, or Firm*—Gibb & Rahman, LLC; Richard M. Kotulak, Esq.

(57) ABSTRACT

Disclosed are embodiments of a method of designing and producing an integrated circuit. During the pre-release chip design process, the method subdivides the overall process window for an integrated circuit design into smaller successive intervals corresponding to achievable performance. Each performance interval is independently optimized for performance versus power by assigning to each interval a different corresponding supply voltage. Timing for the design is then closed for each interval at each assigned voltage. After chip manufacturing, the method measures the performance of the integrated circuits that are manufactured according to the design. Using these performance measurements, the circuits are sorted into bins corresponding to each performance interval and appropriately labeled (e.g., with the performance goal and previously assigned supply voltage corresponding to the performance interval).

14 Claims, 6 Drawing Sheets

U.S. PATENT DOCUMENTS

| | | |
|---|---|---|
| 6,487,701 B1 | 11/2002 | Dean et al. |
| 6,606,729 B2 | 8/2003 | Gross et al. |
| 6,792,582 B1 | 9/2004 | Cohn et al. |
| 6,816,824 B2 | 11/2004 | Chuang et al. |
| 2005/0006602 A1* | 1/2005 | Perdu et al. ............ 250/492.22 |
| 2005/0083077 A1 | 4/2005 | Fleury et al. |
| 2005/0201188 A1 | 9/2005 | Donze et al. |
| 2007/0028194 A1* | 2/2007 | Kurokawa ...................... 716/1 |

OTHER PUBLICATIONS

N.G. Thoma, "Performance Measurement Circuit," IBM Technical Disclosure Bulletin, vol. 39, No. 05, May 1996, pp. 65-66.

Lee, et al., "Test System for Narrowing the Range of Performance Characteristics of Monolithic Integrated Circuits," IBM Technical Disclosure Bulletin, vol. 15, No. 4, Sep. 1972, pp. 1140.

* cited by examiner

INTEGRATED CIRCUIT DESIGN CLOSURE METHOD FOR SELECTIVE VOLTAGE BINNING

BACKGROUND

1. Field of the Invention

The embodiments of the invention generally relate to selective voltage binning and, more particularly, an integrated circuit design timing closure method for selective voltage binning.

2. Description of the Related Art

Consumers continue to demand smaller electronic devices with ever small power requirements. Power consumption from the complementary metal oxide semiconductor (CMOS) integrated circuits commonly used to build such electronic devices consists of two components: dynamic (active) power consumption and static (leakage) power consumption. Dynamic power consumption refers to the amount of power required to operate (i.e., switch) a device. Dynamic power consumption is a function of capacitance, voltage, and switching frequency. That is $P=CV^2F$, where P is the dynamic power, C is the effective switch capacitance, V is the supply voltage and F is the switching frequency. Static power consumption refers to the amount of power consumed by the device when it is not operating (i.e., OFF) and is also an exponential function of the supply voltage. In the past static power consumption was an insignificant portion of overall power consumption. However, with device scaling the ratio of static to dynamic power making up overall power consumption has increased. Thus, optimizing not only dynamic power consumption but also static power consumption is now a major concern for designers of advanced integrated circuits (ICs).

In addressing the issue of static power consumption, designers have realized that manufacturing variations are a critical problem. Specifically, manufacturing variations may cause one or more parameters to vary between integrated circuits that are formed according to the same design. These variations can affect chip operating frequency (i.e., switching speed). For example, due to variations in the equipment, operators, position on a wafer, etc., a specific parameter may vary between chips built on the same wafer, chips built on different wafers in the same lot and/or on chips built on different wafers in different lots. If this parameter is, for example, line width, then the channel width of the transistors on each chip may be different such that the performance varies (e.g., faster or slower). Chips that are fabricated either at the "slow" end or the "fast" end of a process distribution (e.g., a process-temperature-variation (PVT) space) may not be desirable. For example, chips that are fabricated at the "slow" end of such a process distribution may not meet the desired performance specification (i.e., may not have a fast enough switching speed), whereas chips fabricated at the "fast" end of this process distribution may exhibit excessive power and leakage current.

Pre-release chip "design closure" methodologies seek to guarantee circuit timing across the full process distribution for entire ranges of expected voltage and temperature conditions. However, as process control has become more and more difficult, timing closure over the full process distribution has become quite challenging.

Additionally, post-manufacturing voltage binning is a technique that is used to sort manufactured chips into bins based on whether they were fabricated at either the "slow" end or the "fast" end of a process distribution and to vary the voltage requirements for the chips depending upon the bins they are assigned to in order to reduce maximum chip power. Specifically, with slower process chips it takes more voltage to turn on a transistor and less current is produced to drive the load. Thus, in the past the worst case process ranges drove the required voltage for ultimately running the chip. However, with selective voltage binning, every chip is tested to measure operating speed and the chips are sorted accordingly. For example, in a process-voltage-temperature space, the temperature and voltage of the chip may be fixed and the switching frequency may be measured. If the switching frequency is high, then the chip is on the fast end of the process-voltage-temperature space and placed in a fast chip bin. If the switching frequency is low, then the chip is on the slow end of the process-voltage-temperature space and placed in a slow chip bin. After the chips are sorted into bins, an optimal supply voltage (Vdd) for operating the chips in each bin is determined. Since both dynamic power consumption and static power consumption are exponentially proportional to the Vdd, a reduction in the required Vdd will reduce both dynamic and leakage power consumption and, thus, overall power consumption. Therefore, a customer might, for example, be instructed that a fast chip from a fast chip bin may be operated at a certain reduced Vdd in order to minimize static power consumption, while still meeting a given performance specification (i.e., still operating at a desired speed). Whereas, a customer may be instructed that a slow chip from a slow chip bin should be operated at the maximum achievable Vdd in order to meet another performance specification.

It would be advantageous over the prior art to provide a method of designing and manufacturing a chip that combines the pre-release chip design timing closure process with the post-manufacturing binning processes in order to deliver chips that exhibit the best possible performance at acceptable levels of power. Therefore, disclosed herein is a method which subdivides the full process distribution into smaller timing closure intervals during pre-release chip design, each of which is independently optimized for performance versus power by assigning specific application power supply voltage ranges that correspond to each interval. Then, after chip manufacturing, the method tests the timing of each chip and sorts the chips into bins corresponding to the assigned power supply voltage ranges used in the timing closure process.

SUMMARY

In view of the foregoing, disclosed are embodiments of a method of producing an integrated circuit. During the pre-release chip design process, the method subdivides the overall process window for an integrated circuit design into smaller successive intervals corresponding to performance (i.e., performance intervals ranging from worst to best). Each performance interval is independently optimized for performance versus power by assigning to each interval a different corresponding supply voltage (or voltage range). Timing for the design is then closed for each interval at the assigned voltage (or voltage range). After chip manufacturing, the method measures the actual performance of integrated circuits that are manufactured according to the design. Using these performance measurements, the circuits are sorted into groups (i.e., bins) corresponding to each performance interval and labeled with the previously assigned corresponding supply voltage (or voltage ranges).

More particularly, disclosed are embodiments of an integrated circuit design and production method. The method comprises developing a design for an integrated circuit and, specifically, establishing design criteria for the integrated circuit parameters. Overall performance (i.e., speed) of the integrated circuit is dependent upon the manufacturing variations in these parameters.

Once the design is developed, a best case/worst case analysis is conducted in order to determine an overall probability distribution (i.e., a process window) of the manufacturing process variations. The distribution ranges from the probability of manufacturing an integrated circuit with a combination of parameters resulting in the worst case hardware (i.e., slowest hardware) to the probability of manufacturing an integrated circuit with a combination of parameters resulting in the best case hardware (i.e., fastest hardware).

Once the process window is determined, it is divided into successive, preferably overlapping performance intervals (e.g., a first interval, a second interval, a third interval, a fourth interval, etc.) from worst to best (i.e., slowest to fastest).

A different corresponding supply voltage (or voltage range) is assigned to each of the successive performance intervals in order to optimize power consumption for that interval. Specifically, for each successive interval, a determination is made as to what supply voltage is required in order for all of the integrated circuits in that interval to achieve a given performance goal (i.e., a specific speed) and that supply voltage is assigned to that interval, thereby, optimizing power consumption.

Timing of the design is then closed for each interval at the corresponding voltage (or corresponding voltage range) using conventional timing analysis.

Once timing is closed for each of the intervals, multiple integrated circuits can be manufactured according to the design and performance measurements of the multiple integrated circuits can be determined. For example, each of the multiple integrated circuits can be tested in order to determine operating frequency or perform any suitable measurements which indicate integrated circuit speed.

Based on these performance measurements, the multiple integrated circuits are selectively binned according to the different performance intervals.

Once the integrated circuits are binned, instructions (e.g., labels) regarding the supply voltage (or voltage range) at which to operate the integrated circuits within each group can be provided. Additionally, the maximum expected operating temperatures for the integrated circuits within each group can also be provided. Instructions regarding recommended supply voltage can be provided directly to the customer, so that the customer can manually set the different supply voltages. Alternatively, the multiple integrated circuits can be designed and manufactured with programmable fuses that are adapted to record the supply voltage information. Consequently, after sorting the integrated circuits into the various groups, they can be programmed to indicate the required supply voltage for operating the specific integrated circuit. If appropriately configured, a customer's system may read the supply voltage information programmed into the integrated circuit and automatically connect the integrated circuit to the correct supply voltage.

These and other aspects of the embodiments of the invention will be better appreciated and understood when considered in conjunction with the following description and the accompanying drawings. It should be understood, however, that the following descriptions, while indicating various embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
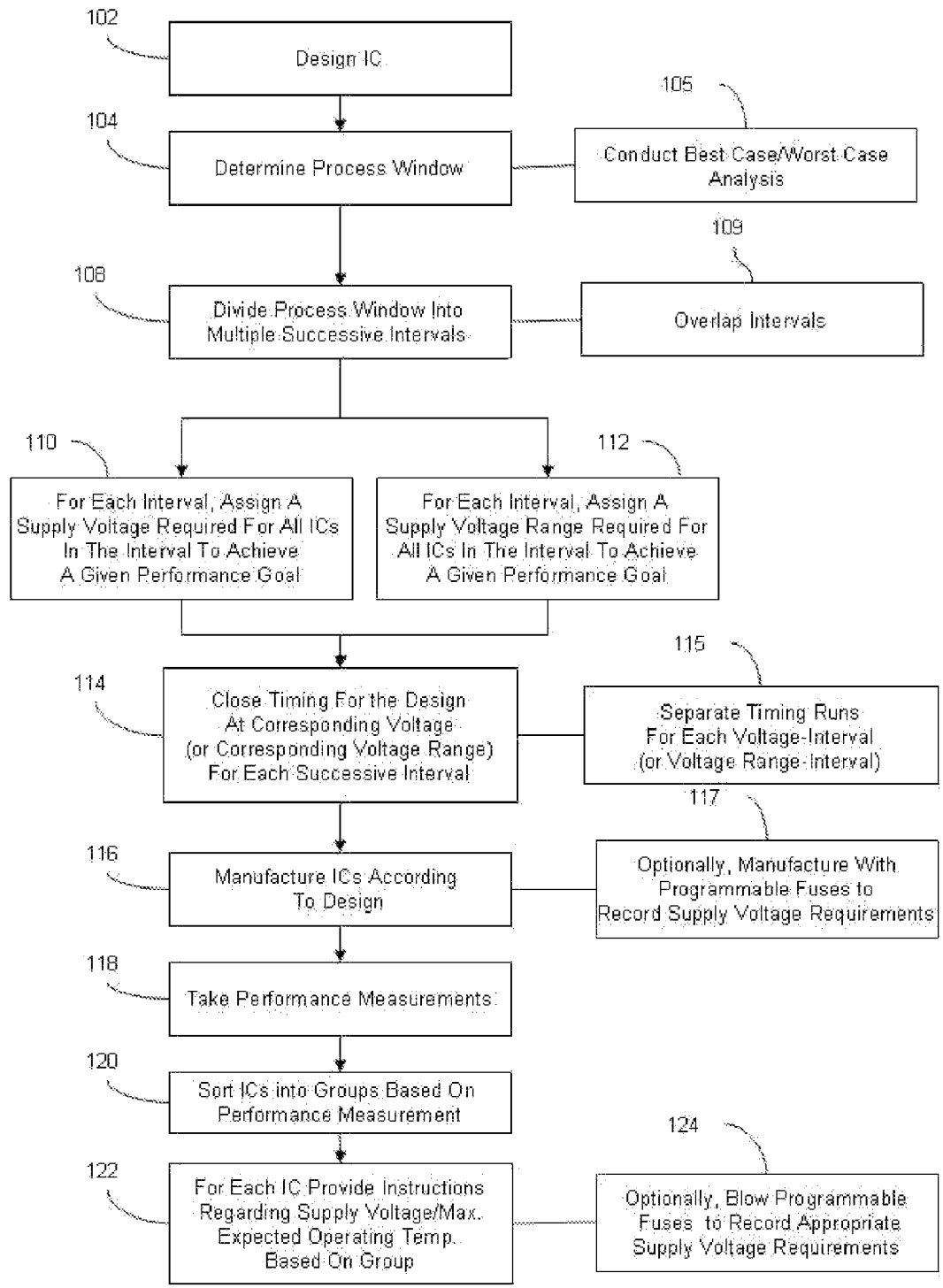
FIG. 1 is a flow diagram illustrating embodiments of the method of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, it would be advantageous over the prior art to provide a method of designing and manufacturing a chip that combines the pre-release chip design timing closure process, described above, with the post-manufacturing binning processes (also described above) in order to deliver chips that exhibit the best possible performance at acceptable levels of power. In view of the foregoing, disclosed herein are embodiments of a method of designing and producing an integrated circuit. During the pre-release chip design process, the method subdivides the overall process window for an integrated circuit design into smaller successive intervals corresponding to achievable performance (i.e., performance intervals). Each performance interval is independently optimized for performance versus power by assigning to each interval a different corresponding supply voltage (or voltage range). Timing for the design is then closed for each interval at each assigned voltage (or voltage range). After chip manufacturing, the method measures the performance of the integrated circuits that are manufactured according to the design. Using these performance measurements, the circuits are sorted into groups (i.e., bins) corresponding to each performance interval and appropriately labeled (e.g., with the performance goal and previously assigned supply voltage (or voltage range) corresponding to the performance interval and/or with the maximum expected operating temperatures based on performance goal and previously assigned supply voltage (or voltage range)).

More particularly, referring to FIG. 1, disclosed are embodiments of an integrated circuit production method. The method comprises developing a design for an integrated circuit that specifically sets out design criteria for various parameters (102). Although the design criteria are set out for each of the parameters, the manufacturing line can only guarantee that each parameter will be within a certain range (i.e., each of the parameter values will vary within the range based upon manufacturing process variations). Overall performance (i.e., speed) of the integrated circuit is dependent upon the variations in these parameters. Thus, once the design is developed, a best case/worst case analysis is conducted using conventional methodologies in order to determine an overall probability distribution of the process variations (104-105). Specifically, the probability distribution ranges from the probability of manufacturing an integrated circuit with a combination of parameters resulting in the worst case hardware 210 (i.e., slowest hardware at sigma ($\sigma$)=–N, where N can, for example, comprise 3 for a three-sigma design or 6 for a six-sigma design) to the probability of manufacturing an integrated circuit with a combination of parameters resulting in a nominal case hardware 215 to the probability of manufacturing an integrated circuit with a combination of parameters resulting in a best case hardware 220 (i.e., fastest hardware at sigma ($\sigma$)=+N, where N can, for example, comprise 3 for a three-sigma design or 6 for a six-sigma design) (see FIG. 2).

Once the probability distribution (i.e., the process window 200 from worst case 210 to best case 220) is determined (at process 104), the probability distribution 200 is divided into successive performance intervals from worst to best (e.g., a first interval 301a and a second interval 301b (see FIG. 3) or multiple successive intervals 401a-n (see FIG. 4) (108). Each of the successive intervals can extend between two of values within the distribution 200 and can preferably overlap any adjacent intervals (109). For example, referring to FIG. 3, if the process distribution 200 is divided into a first interval 301a and a second interval 301b, the first interval 301a can extend from a first value 311 (e.g., the worst case hardware 210, where $\sigma$=–N) to a second value 312 (e.g., nominal hardware between the worst case hardware 210 and the best case hardware 220). The second interval 301b can extend from a third value 313 (e.g., different nominal hardware between the first value 311 and the second value 312) to a fourth value 314 (e.g., the best case hardware 220, where $\sigma$=+N) such that the first interval 301a and the second interval 301b overlap. By overlapping the intervals, the method accounts for mismatch during subsequent timing closure (see detailed discussion below).

Figure 3:
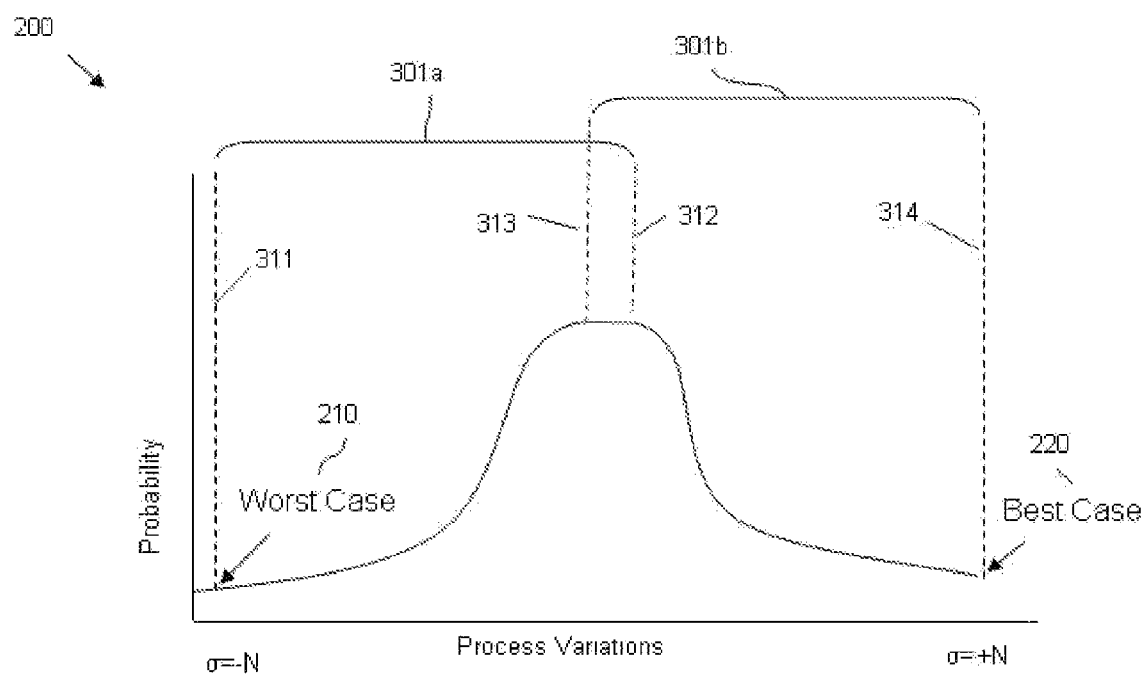
FIG. 3 is a graph illustrating an exemplary process window divided into two successive intervals.
Figure 4:
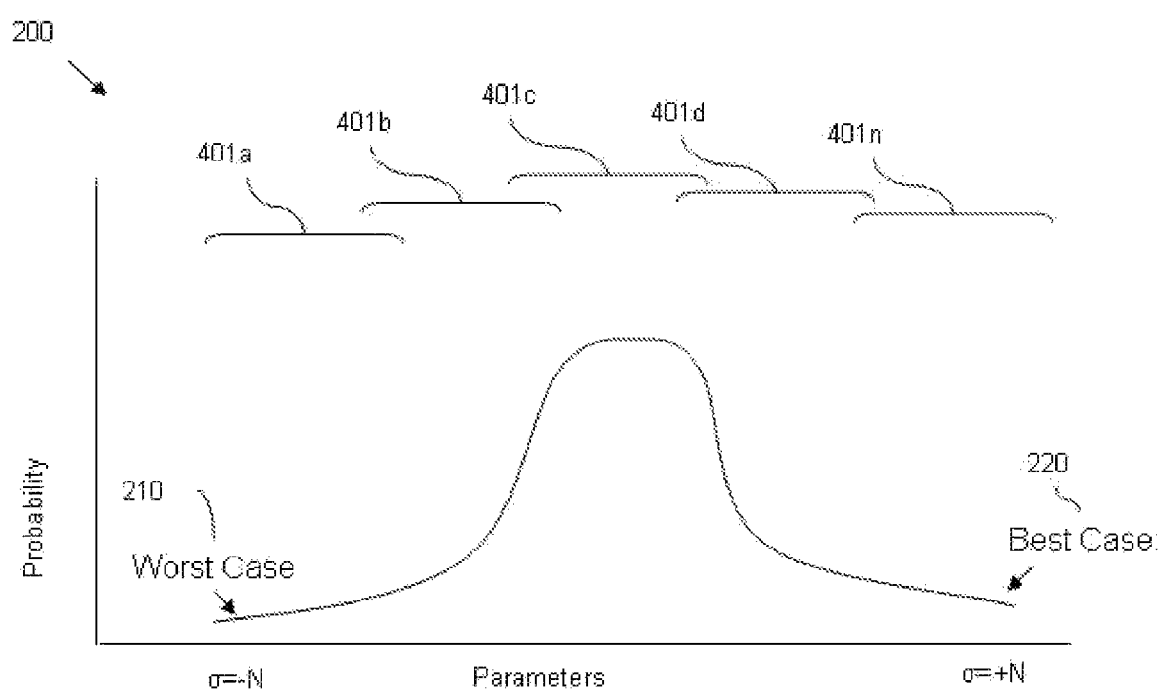
FIG. 4 is a graph illustrating an exemplary process window divided into multiple successive intervals.

Since the intervals 301a-b of FIG. 3 and 401a-n of FIG. 4 are successive, the achievable performance (i.e., achievable speed) when operating at the same supply voltage will increase from interval to interval and, thus, both the dynamic and static (leakage) power consumed by each of the integrated circuits falling within the different intervals will increase from interval to interval.

After dividing the probability distribution 200 into intervals at process 108, a different corresponding supply voltage is assigned to each of the successive intervals in order to optimize overall power consumption (110). Specifically, for each successive interval (e.g., see successive intervals 301 a-b of FIG. 3 and 401 a-n of FIG. 4), a determination is made as to what supply voltage is required in order for all of the integrated circuits in that interval to achieve a given performance goal (i.e., a specific speed) and that supply voltage is assigned to that interval in order to optimize power consumption.

More particularly, since the probability distribution ranges from worst case to best case, the achievable performance (i.e., achievable speed) for integrated circuits formed according to the design will increase from interval to interval, if operated at the same supply voltage. However, referring to FIGS. 5 and 6, instead of allowing chips to perform faster, power consumption versus performance can be optimized by assigning different supply voltages to the different intervals (e.g., see supply voltages 551 and 552b of intervals 561 and 562 and supply voltages 651-653 of intervals 661-663, respectively). Specifically, as mentioned above, both dynamic power and static power are components of the total power consumption 570, 670. Dynamic power increases with increased circuit speed. Both dynamic and static (leakage) power increase under fast process conditions. Thus, if all of the integrated circuits manufactured according to the same design (i.e., within the different performance intervals) are to be operated at the same supply voltage (e.g., at the first voltage 551, 651), then both the dynamic and static (leakage) power will increase from interval to interval and the total power consumption 570, 670 will necessarily increase. However, if the faster speeds are not required, then power consumption can be optimized over performance for each interval by decreasing the required supply voltage from interval to interval. Specifically, since both static power consumption and dynamic power consumption are exponential functions of the supply voltage, decreasing the supply voltage from interval to interval will necessarily decrease overall power consumption (e.g., see lower Vdd 552b for interval 562 of FIG. 5 and lower Vdds 652-653 for intervals 662-663, respectively, of FIG. 6).

Figure 5:
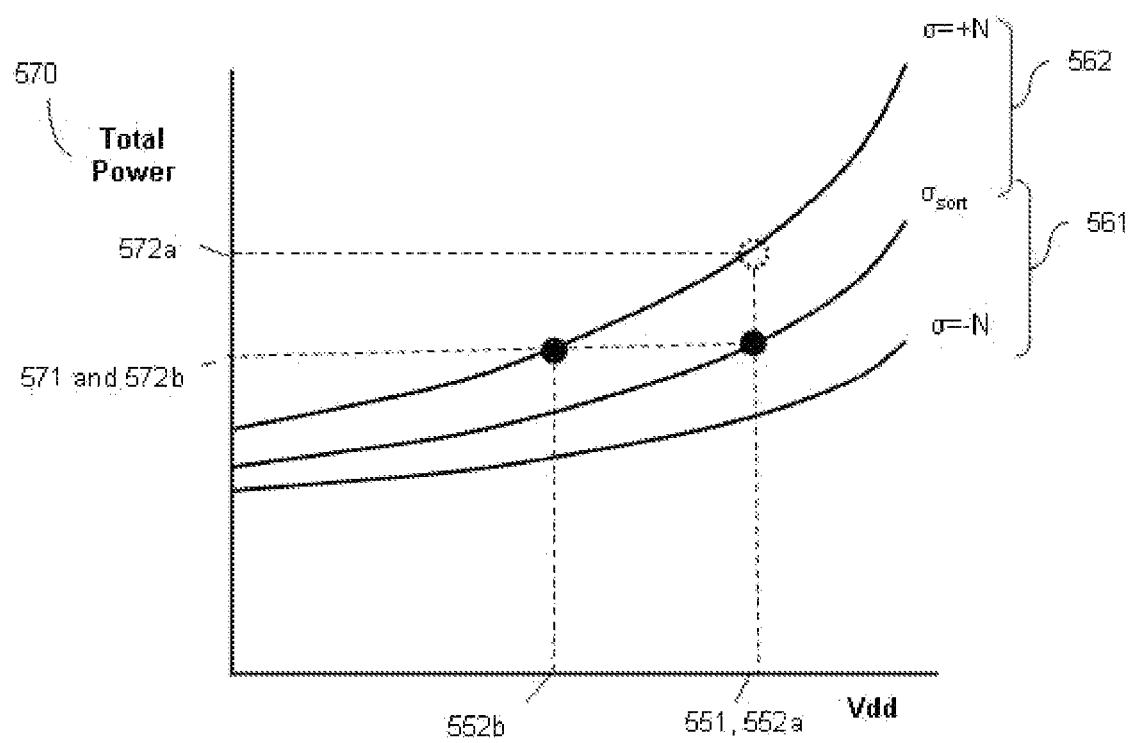
FIG. 5 is a graph illustrating power consumption optimization between two successive intervals.
Figure 6:
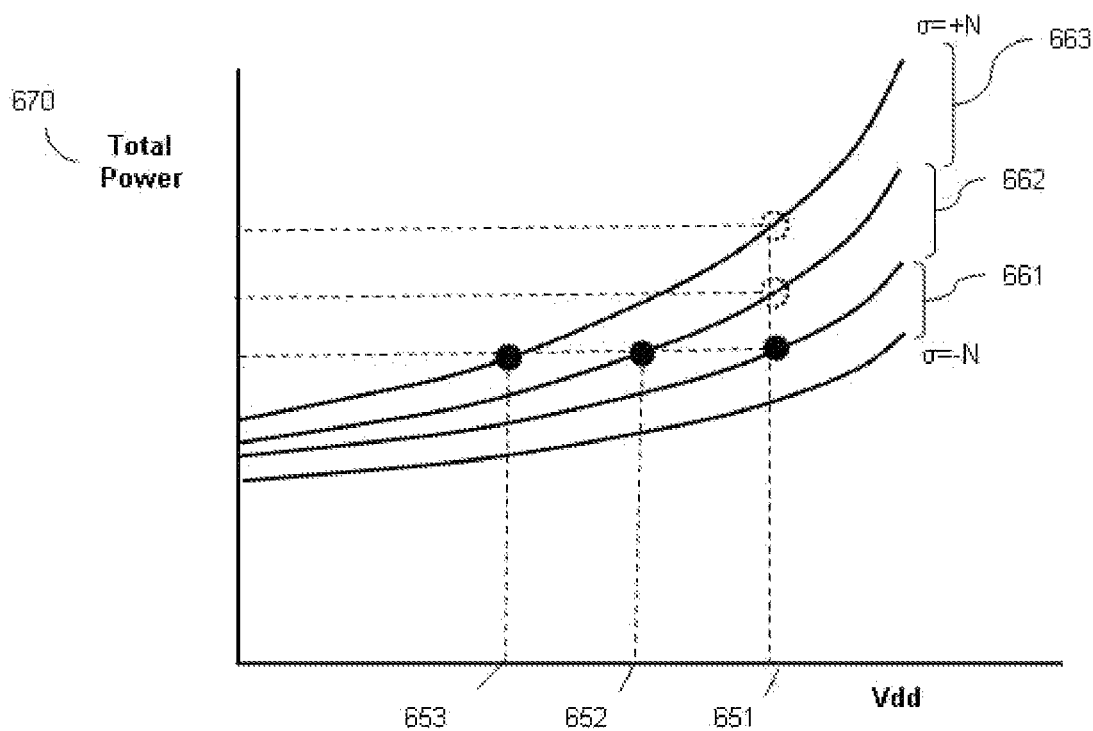
FIG. 6 is a graph illustrating power consumption optimization between multiple successive intervals.

For example, referring to FIG. 5, the first performance goal for the first interval 561 can be the maximum speed that is achievable by any integrated circuit hardware that falls within that interval (including, the worst case hardware 210 of FIG. 2) when operated at the assigned first supply voltage 551. If the supply voltage 552a assigned to integrated circuits falling in the second interval 562 is the same as the first supply voltage 551, faster performance goals would be achievable but the power consumption 572a for circuits in the second interval 562 will be higher than the power consumption 571 for circuits in the first interval 561. However, if faster circuits are not required, then the supply voltage assigned to the second interval 562 can be reduced (e.g., see second supply voltage 552b) and, thereby, the total power consumption can be reduced (see power consumption 572b). Thus, anticipated process variations in circuits manufactured according to the same design can be exploited to achieve higher performance goals or, alternatively, to achieve the same performance goals with reduced supply voltage requirements 551, 552b and reduced power consumption.

Alternatively, as opposed to assigning a different voltage value to each of the successive intervals (at process 110), corresponding voltage ranges can be assigned (112). These corresponding voltage ranges can comprise the determined supply voltage (as described above at process 110) plus or minus a predetermined margin of error. This error value can account for possible fluctuations in the supply voltage. For example, a first voltage range that comprises a first voltage and a first predetermined error value (e.g., 1.1 volts+/−0.1 volts) can be assigned as can a second voltage range that comprises a second voltage and a second predetermined error value (e.g., 0.75 volts+/− 0.1 volts). In some applications, it may be desirable to determine a system power supply tolerance independently for each supply voltage range. In cases where the tolerance is tighter, this could be exploited in the described method by assigning different voltage ranges per process interval, further simplifying IC timing closure.

After the corresponding voltages (or voltage ranges) are assigned to each interval (at processes 110 or 112), timing of the design can be closed at those corresponding voltages or voltage ranges for each of the successive intervals (114). Generally, timing closure is the process of modifying and optimizing a design such that the timing requirements of the design are satisfied. The timing requirements typically include, but are not limited to, ensuring that the arrival times of all logic paths occur within an expected range relative to the expected operating frequency or operating frequencies of the design, ensuring that the set up and hold times are met on all sequential elements (e.g., flip-flops), and ensuring that clocks are distributed with acceptable latency and pulse width. More specifically, timing closure of integrated circuits often involves an evaluation of signal propagation at two extremes, fast and slow, of circuit speed. The slow signal propagation generally occurs at the nexus of the worst case hardware achievable during manufacture, the worst case operating temperature (e.g., typically high operating temperature for complementary metal oxide semiconductor (CMOS)) and the minimum allowable operating voltage of the integrated circuit. Whereas, the fast signal propagation occurs at the nexus of the best-case hardware achievable during manufacture, the best case operating temperature (e.g., typically low for complementary metal oxide semiconductor (CMOS)) and the maximum allowable operating voltage of the integrated circuit. However, the embodiments of the present method subdivide the timing closure process based on the intervals determined at process 108, and specifically, based on the different voltages assigned to the different intervals at process 114. Thus, separate timing runs will be required for each interval (115) and each interval will have a different slow signal propagation and fast signal propagation.

Figure 2:
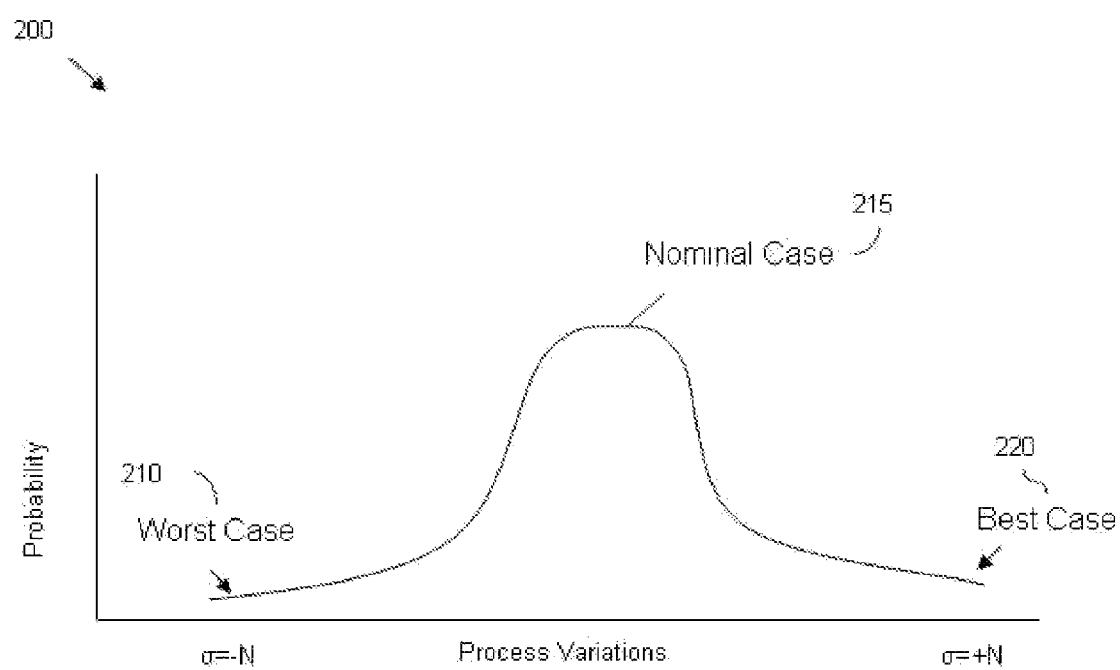
FIG. 2 is graph illustrating an exemplary process window.

By overlapping the intervals at process 109, the method accounts for mismatch. More specifically, selective voltage binning procedures typically use several performance screen ring oscillator (PSRO) measurements to quantify chip performance after manufacturing. Since this is done at a known voltage and temperature, the PSRO measurements are essentially a statement of the aggregate effect of a wide variety of different process parameters upon that circuit. FIGS. 2-4, for example, represent the collection of these parameters as a single quantity called "process". However, different types of circuits are typically present within a single chip, even within a purely digital CMOS IC design, and some of these different types of circuits will exhibit different sensitivities to the "process". Thus, if a PSRO or some set of sample/reference logic paths are used to determine "process", there will likely be some circuits that inevitably track differently such that they are at a slightly different point (e.g., sigma) in their best case to worst case performance range. Consequently, the overlapping of the intervals should be set to a level that is intended to account for this effect. The significance of this is greater around nominal process as different parameters have to be pushed in the same direction to reach worst case or best case, but multiple different parameter choices can result in an approximately nominal case. However, those skilled in the art will recognize that if a large number of sample/reference paths were used to determine the "process", this mismatch effect would be minimized. Thus, the need to overlap the intervals would be minimized or even eliminated; the trade-off being a more comprehensive post-manufacturing testing process versus a wider overlap window.

Consequently, if the process window is divided into a first interval 301a and a second interval 301b, as illustrated in FIG. 3, the first voltage (or first voltage range) can be used to close timing for the first interval and the second voltage (or second voltage range) can be used to close timing for the second interval (114). Separate timing runs are required for each interval 301a-b and both will have a different slow and fast signal propagations. The slow signal propagation for the first interval 301 a will occur at the nexus of the worst case hardware 210 (e.g., at the first value 311), the worst case operating temperature and minimum allowable operating voltage of the integrated circuit. The fast signal propagation for the first interval 301a will occur at the nexus of the second value 312 (e.g., corresponding to a nominal case hardware), a nominal operating temperature and a nominal operating voltage of the integrated circuit. Whereas, the slow signal propagation for the second interval 301b will occur at the nexus of the third value 313 (e.g., corresponding to a different nominal case hardware), a nominal operating temperature and a nominal operating voltage of the integrated circuit. The fast signal propagation for the second interval will occur at the nexus of best case hardware 220 (e.g., at the fourth value 314), the best operating temperature and a maximum allowable operating voltage of the integrated circuit.

More particularly, different timing methodologies may be used in conjunction with the method of the invention and those different methodologies may vary depending upon the type of integrated circuit technology being formed, the type of Static Timing Analysis tool available, and the type of process-specific timing model provided by the application specific integrated circuit (ASIC) library provider. The ability to time the design at various process points is required.

This can be implemented using, for example, IEEE 1481 Delay and Power Calculation models (DPCM) of The Institute of Electrical and Electronic Engineers, Inc. The DPCM can calculate circuit delays and timing requirements (setup and hold) across a continuous range of voltage and temperature. The DPCM also supports timing across the process distribution. One exemplary implementation with DPCM comprises using a linear combination of delays between fast, slow and nominal process speeds to time at any process point in the process space. If the DPCM is characterized to model timing continuously across the process distribution, for example, through the use of a sigma parameter that represents a point in the process space, then this can be used to close timing at the required process points.

Alternatively, a Synopsys .lib timing model can be used for implementation. Since the .lib format models timing at a specific process, voltage and temperature point, separate .lib models are required for fast, slow and nominal process speeds. In this case, either a .lib at the required process points, or K-factors (which scale the timing models speeds to a specific process point) could be used to model the required process point. The .lib libraries must also be characterized at the appropriate voltage and temperature ranges for the fast and slow bins, or a K-factor must be used.

All other timing closure requirements (e.g., temperature range, metal variation, etc.) remain the same as in the normal (non-binned) timing closure.

By using the smaller process variation windows, the timing constraints during closure are eased. However, since the number of timing runs increases as the number of intervals increases, the benefit of adding multiple intervals should be balanced against the cost.

Once timing is closed for each of the intervals (at process 114), multiple integrated circuits can be manufactured according to the design (116). The multiple integrated circuits can then be tested to evaluate the "process point" of each integrated circuit (118). Specifically, performance measurements can be taken by running speed tests or performing any other suitable test for that indicates integrated circuit speed. For example, an on-chip performance screen ring oscillator (PSRO) can be used to determine the switching frequency of each integrated circuit without having to run speed tests.

Based on these actual performance measurements, the multiple integrated circuits can be selectively binned (120). That is, the performance data can be used to assign integrated circuits to specific intervals of the process distribution and sort them into groups corresponding to the intervals. For example, referring to FIG. 3, if the process distribution was divided into a first performance interval 301a capable of achieving relatively slower speeds and a second interval 301b capable of achieving relatively faster speeds, then the integrated circuits will be sorted into a first group corresponding to the first interval (i.e., the slower integrated circuits) and a second group corresponding to the second interval (i.e., the faster integrated circuits).

Once the integrated circuits are sorted, they can be labeled with different part numbers depending upon the group to which they are assigned. Furthermore, instructions regarding the required supply voltage or supply voltage range to operate the integrated circuits within each group as well as the maximum expected operating temperature for integrated circuits within each group can be provided (122). For example, each packaged integrated circuit can be labeled with a different voltage-specific part number that indicates the performance interval-voltage level group into which that integrated circuit has been sorted and the voltage at which that circuit should be operated.

More particularly, the required supply voltage or voltage range for a specific group should be given as that supply voltage or voltage range that was previously assigned to the corresponding performance interval (at processes 110 or 112) and used during timing closure (at process 114). For example, these instructions/labels/part numbers can indicate that an integrated circuit from a first group corresponding to a first interval should operate at the previously assigned first voltage or within the previously assigned first voltage range and an integrated circuit from a second group corresponding to a second interval should operate at the previously assigned second voltage or within the previously assigned second voltage range. Appropriately, labeling the circuits in this manner will ensure that when used power consumption will be optimized. Providing these instructions directly to the customer (e.g., on package labels), allows the customer to manually set the different supply voltages.

Alternatively, the multiple integrated circuits can be designed and manufactured with programmable fuses or other non-volatile memory elements that are adapted to record the supply voltage information (at process 116-117) and that are accessible by a Test Access Port (TAP) or by connecting I/O drivers to the output(s) of the fuse bank. Consequently, after sorting the integrated circuits into the various groups (at process 120), they can be selectively programmed (i.e., by blowing appropriate fuses, or writing appropriate data to non-volatile memory) to indicate the required supply voltage information for operating the specific integrated circuit (124). For example, integrated circuits in the first group can be programmed to indicate that they should operate at the first voltage or within the first voltage range, integrated circuits in the second group can be programmed to indicate that they should operate at the second voltage or within the second voltage range, etc. If appropriately configured, a customer's system may read the on-chip supply voltage information and automatically connect the integrated circuit to the correct supply voltage. That is, the customer's application board assembler could program the integrated circuit power supply voltage accordingly. Thus, optimal process variations in circuits manufactured according to the same design can be exploited to achieve higher performance goals or, alternatively, to achieve the same performance goals with reduced supply voltage requirements 551, 552b and reduced power consumption.

The embodiments of the method, described above, may similarly be used to optimize performance versus operating temperature. Specifically, absent external heat sources, the operating temperature of an integrated circuit is dependent upon both power and voltage. Consequently, if the integrated circuits all have the same performance goal, but the recommended supply voltage or voltage range decreases from interval to interval (i.e., from group to group), then the maximum expected operating temperature will also decrease from interval to interval (i.e., from group to group). For example, if an integrated circuit is from a group that is assigned to be operated at a lower supply voltage and the operating temperature of that particular circuit is independent of external factors, then that circuit will necessarily operate at a lower maximum operating temperature than another circuit from a different group that is assigned to be operated at a higher supply voltage. Thus, the circuit labels for the integrated circuits within the different groups can include the different maximum expected operating temperatures as well as the different supply voltages (or supply voltage ranges).

Therefore, disclosed above are embodiments of a method of designing and producing an integrated circuit. During the pre-release chip design process, the method subdivides the overall process window for an integrated circuit design into smaller successive intervals corresponding to achievable performance (i.e., performance intervals). Each performance interval is independently optimized for performance versus power by assigning to each interval a different corresponding supply voltage (or voltage range). Timing for the design is then closed for each interval at each assigned voltage (or voltage range). After chip manufacturing, the method measures the performance of the integrated circuits that are manufactured according to the design. Using these performance measurements, the circuits are sorted into groups (i.e., bins) corresponding to each performance interval and appropriately labeled (e.g., with the performance goal and previously assigned supply voltage (or voltage range) corresponding to the performance interval and/or with the maximum expected operating temperatures based on performance goal and previously assigned supply voltage (or voltage range). The method may be used to exploit performance variations due to manufacturing process variations in order optimize both dynamic and static power consumption circuits with minimal additional development and cost. The method may further reduce the number of hold padding cells and, thereby, further reduce the power consumption, reduce the size of the integrated circuit, and ease timing closure.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. An integrated circuit production method comprising:
developing a design for an integrated circuit comprising parameters, wherein performance of said integrated circuit is dependent upon said parameters;
determining a probability distribution for said parameters based upon manufacturing process variations, said probability distribution ranging from a probability of manufacturing said integrated circuit with a combination of said parameters resulting in a worst-case hardware configuration for performance to a probability of manufacturing said integrated circuit with a combination of said parameters resulting in a best-case hardware configuration for performance;

dividing said probability distribution into a first interval and a second interval;

assigning a first voltage to said first interval, wherein said first voltage is necessary to achieve a first performance goal;

assigning a second voltage to said second interval, wherein said second voltage is necessary to achieve a second performance goal and wherein said first voltage and said second voltage are different;

closing timing for said design at said first voltage for said first interval and at said second voltage for said second interval forming multiple integrated circuits according to said design;

determining performance measurements for said multiple integrated circuits;

based on said performance measurements, sorting said multiple integrated circuits into a first group corresponding to said first interval and a second group corresponding to said second interval; and indicating at least one of said first group should operate at said first voltage and said second group should operate at said second voltage, and a first maximum expected operating temperature for said first group and a second maximum expected operating temperature for said second group.

2. The method of claim 1, wherein said first interval and said second interval overlap.

3. The method of claim 1, wherein said determining of said performance measurements comprises testing each of said multiple integrated circuits in order to determine a frequency for each of said multiple integrated circuits.

4. The method of claim 1, further comprising:
manufacturing said multiple integrated circuits with programmable fuses adapted to record supply voltage information; and
after sorting said multiple integrated circuits, programming said programmable fuses to indicate that said integrated circuits in said first group should operate at said first voltage and said integrated circuits in said second group should operate at said second voltage.

5. An integrated circuit production method comprising:
developing a design for an integrated circuit comprising parameters, wherein performance of said integrated circuit is dependent upon said parameters;
determining a probability distribution for said parameters based upon manufacturing process variations, said probability distribution ranging from a probability of manufacturing said integrated circuit with a combination of said parameters resulting in a worst-case hardware configuration for performance to a probability of manufacturing said integrated circuit with a combination of said parameters resulting in a best-case hardware configuration for performance;
dividing said probability distribution into a first interval and a second interval;
assigning a first voltage range to said first interval, wherein said first voltage range is necessary to achieve a first performance goal;
assigning a second voltage range to said second interval, wherein said second voltage range is necessary to achieve a second performance goal and wherein said first voltage range and said second voltage range are different;
closing timing for said design at said first voltage range for said first interval and at said second voltage range for said second interval forming multiple integrated circuits according to said design;
determining performance measurements for said multiple integrated circuits;
based on said performance measurements, sorting said multiple integrated circuits into a first group corresponding to said first interval and a second group corresponding to said second interval;
indicating at least one of said first group should operate at said first voltage and said second group should operate at said second voltage, and a first maximum expected operating temperature for said first group and a second maximum expected operating temperature for said second group.

6. The method of claim 5, wherein said first interval and said second interval overlap.

7. The method of claim 5, wherein said determining of said performance measurements comprises testing each of said multiple integrated circuits in order to determine a frequency for each of said multiple integrated circuits.

8. The method of claim 5, further comprising:
manufacturing said multiple integrated circuits with programmable fuses adapted to record supply voltage information; and
after sorting said multiple integrated circuits, programming said programmable fuses to indicate that said integrated circuits in said first group should operate at said first voltage and said integrated circuits in said second group should operate at said second voltage.

9. An integrated circuit production method comprising:
developing a design for an integrated circuit comprising parameters, wherein performance of said integrated circuit is dependent upon said parameters;
determining a probability distribution for said parameters based upon manufacturing process variations, said probability distribution ranging from a probability of manufacturing said integrated circuit with a combination of said parameters resulting in a worst-case hardware configuration for performance to a probability of manufacturing said integrated circuit with a combination of said parameters resulting in a best-case hardware configuration for performance;
dividing said probability distribution into successive intervals;
assigning to each of said successive intervals a corresponding voltage necessary to achieve a selected performance goal such that said corresponding voltage is different for each of said successive intervals;
closing timing for said design at said corresponding voltage for each of said successive intervals forming multiple integrated circuits according to said design;
determining performance measurements for said multiple integrated circuits;
based on said performance measurements, sorting said multiple integrated circuits into groups wherein each of group corresponds to said successive interval; and
indicating which one of said corresponding voltages should be used to operate each of said integrated circuit in each of said groups.

10. The method of claim 9, wherein each of said successive intervals overlaps any adjacent intervals.

11. The method of claim 9, wherein said determining of said performance measurements comprises testing each of said multiple integrated circuits in order to determine a frequency for each of said multiple integrated circuits.

12. The method of claim 9, further comprising:
- manufacturing said multiple integrated circuits with programmable fuses adapted to indicate voltage requirements; and
- after sorting said multiple integrated circuits, programming said programmable fuses to indicate which one of said corresponding voltages should be used to operate each of said integrated circuits in each of said groups.

13. The method of claim 9, further comprising indicating maximum expected operating temperatures for each of said groups.

14. The method of claim 9, wherein said corresponding voltages comprise corresponding voltage ranges.

* * * * *